(12) United States Patent
Goodner

(10) Patent No.: US 6,893,985 B2
(45) Date of Patent: May 17, 2005

(54) UV-ACTIVATED DIELECTRIC LAYER

(75) Inventor: Michael D. Goodner, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/403,532

(22) Filed: Mar. 31, 2003

(65) Prior Publication Data

US 2004/0191696 A1 Sep. 30, 2004

(51) Int. Cl.$^7$ .............................................. H01L 21/31
(52) U.S. Cl. ..................................... 438/795; 438/781
(58) Field of Search ................................ 438/781, 795, 438/960

(56) References Cited

U.S. PATENT DOCUMENTS 6,670,285 B2 * 12/2003 Hawker et al. ............. 438/780
6,703,324 B2 * 3/2004 Wong ......................... 438/787
6,716,767 B2 * 4/2004 Shih et al. .................. 438/760

* cited by examiner

*Primary Examiner*—Alexander Ghyka
(74) *Attorney, Agent, or Firm*—Trop, Pruner & Hu, P.C.

(57) ABSTRACT

A dielectric layer on a semiconductor substrate is made porous by radiation with UV light. The dielectric material contains a photosensitive moiety that absorbs UV radiation and dissociates from the dielectric material. The UV-activated material then may be diffused to create pores in the dielectric layer, and to provide a dielectric layer having a low dielectric constant.

16 Claims, 2 Drawing Sheets

UV-ACTIVATED DIELECTRIC LAYER

FIELD OF THE INVENTION

This invention relates generally to semiconductor devices having one or more dielectric insulating layers with a low dielectric constant, and methods for making porous dielectric layers in such devices.

BACKGROUND

Semiconductor devices include metal layers that are insulated from each other by dielectric layers. As device features shrink, reducing the distance between the metal lines on each layer, capacitance increases. The parasitic capacitance may contribute to effects such as RC delay, power dissipation, and capacitively coupled signals, also known as cross-talk. To address this problem, insulating materials that have relatively low dielectric constants (referred to as low-k dielectrics) are being used in place of silicon dioxide (and other materials that have relatively high dielectric constants) to form the dielectric layer that separates the metal lines.

Attempts have been made to lower the dielectric constant by increasing the porosity of dielectric materials. For example, some porous dielectric materials use thermally activated porogens. When heat is applied, the porogen may decompose and/or volatize, leaving pores in the dielectric material. Lower dielectric constants are possible because the pores are voids having dielectric constants near one (1).

Pores in dielectric materials typically have been generated by thermal processing. For example, one such dielectric material is a silsesquioxane matrix containing porogens, which may be spun on to the substrate. Heating the material causes the porogen to decompose and vaporize, leaving pores in the dielectric layer, thereby decreasing the dielectric constant of that layer.

However, heating during other process steps can cause a porogen to decompose prematurely. For example, other process steps that require thermal input (such as photoresist bake and ashing steps or subsequent deposition steps for dielectric etch stop or metallic layers), may thermally decompose the porogen, resulting in various problems. Premature thermal decomposition of porogens, for example, can result in rough sidewall surfaces of metal interconnects. Additionally, some porogens, such as those based on poly (ethylene oxide) or similar materials, may be lost prematurely due to resist cleans that can attack or solubilize the porogen.

A porous dielectric material is needed that will not decompose prematurely during process steps that occur at high temperatures. A method of providing a porous dielectric material having a low dielectric constant is needed. A dielectric material and method is needed that will not be susceptible to premature decomposition of porogens, for use in forming dual damascene and similar interconnects in increasingly smaller semiconductor device geometries.

DETAILED DESCRIPTION

Figure 1:
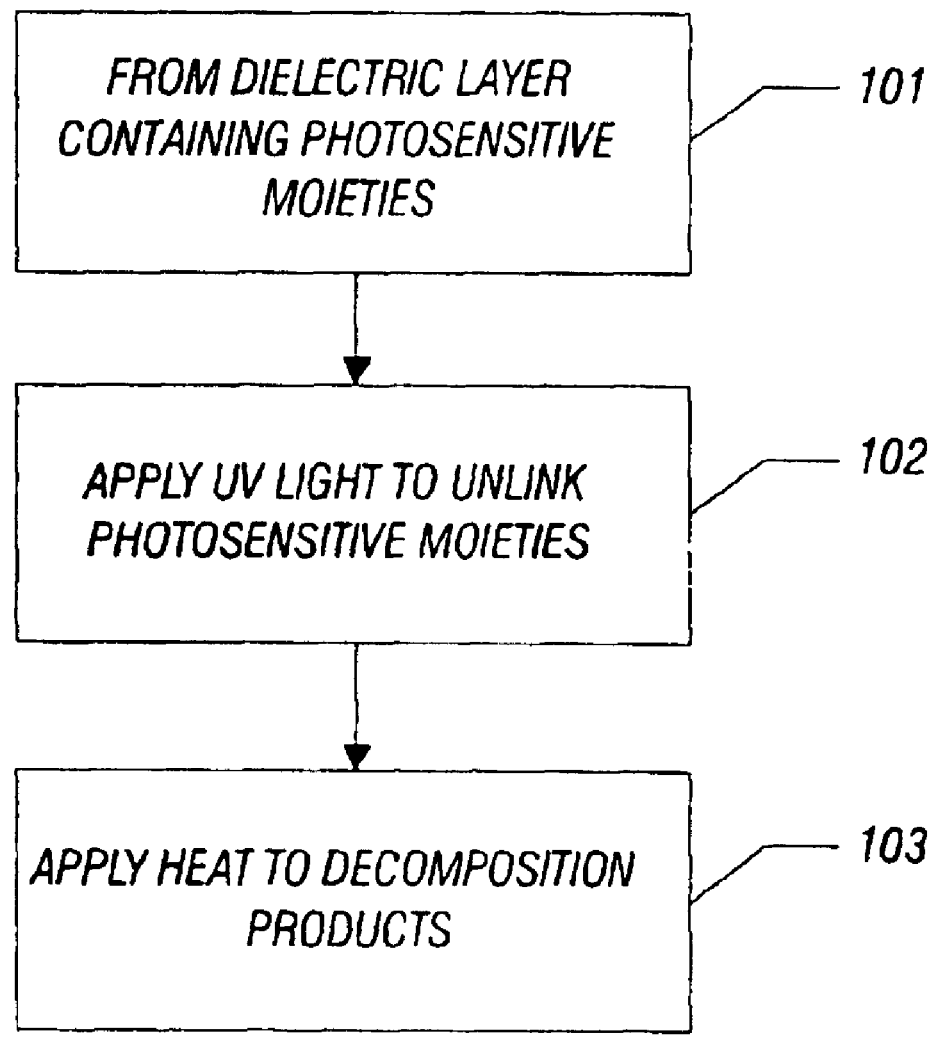
FIG. 1 is a block diagram of a method of forming a porous dielectric layer according to one embodiment.

In one embodiment, as shown in FIG. 1, a dielectric layer is formed on a substrate, and pores are formed in the dielectric layer by application of ultraviolet (UV) light energy.

In block 101, a dielectric material is applied to a substrate by spin-coating, evaporative deposition, or physical vapor deposition. The dielectric material may be a variety of materials ranging from a spin-on glass to organic materials such as paralyene. The dielectric layer may be applied over a conductive metal layer. A barrier layer also may be positioned between the dielectric layer and metal layer. Optionally, a non-hermetic capping layer may be formed over the dielectric layer.

The dielectric material includes one or more photosensitive moieties. In one embodiment, the dielectric material provides a "backbone" onto which photosensitive moieties may be linked and functionalized.

In one embodiment, the photosensitive moiety may be the absorbent moiety (hereafter synonymously referred to as "antenna") from a photoacid generator (PAG) linked to a dielectric "backbone." Functional groups such as acid groups attached to the dielectric material facilitate attachment of photosensitive moieties. For example, the photosensitive moiety may be linked to the dielectric "backbone" with a carboxylate, phnenoxy group, or other similar functionality.

Photoacid generators are salts which have an antenna functionality. By incorporating the light absorbing moiety or antenna as a side group linked to the dielectric material, the PAG antenna moiety may be used as a photoactive, "backbone"-bound porogen.

Thus, the dielectric "backbone" may be functionalized with an antenna functional group. For example a polymer dielectric "backbone" may be synthesized or functionalized to have carboxylic acid moieties that are subsequently functionalized to form a diphenylpropylsulfonium salt. Other common photosensitive antenna moieties that may be used in embodiments of the invention include triphenyl sulfonium, alkylphenyl suulfonium, diphenyl iodonium, phenylpropyl iodonium, alkylphenyl iodonium, diphenyl p-alkoxyphenyl, diphenyl p-alkylphenyl, and dibutylnaphthysulfonium salts.

Optionally, an anti-reflective and/or light absorbing layer may be applied over the dielectric layer. This may prevent premature activation or decomposition of the PAG during lithographic patterning of the dielectric, if further processing is required before generating pores in the dielectric material. Such further processing may include etching trenches or vias, depositing dielectric or metal layers, plating metal layers, chemical mechanical polish, or other processes as is apparent to those skilled in the art.

In block 102, ultraviolet (UV) light may be used to control the generation of pores in the dielectric material. Irradiating the dielectric material with UV light causes the photosensitive moieties to cleave from the "backbone" and become volatile and/or become low molecular weight species. When exposed to UV light, the antenna absorbs the radiation and then dissociates from the "backbone", generating an acid (by donating a hydrogen atom through beta hydride elimination or similar mechanisms, or abstracting a hydrogen atom from the surrounding media) and several other lower energy decomposition products, such as benzene and phenyl sulfide.

For example, a diphenylpropylsulfonium antenna moiety may dissociate and generate an acid (on the dielectric backbone) along with other decomposition products such as diphenyl sulfide and propene. Other decomposition products also may be created upon exposure to UV radiation, in addition to those based on β-hydride elimination. For example, triphenylsulfonium is an antenna moiety that dissociates into diphenyl sulfide and benzene or a benzene derivative.

Thus, UV radiation may be used to switch the dielectric material from a mechanically strong material with a relatively high dielectric constant to a mechanically weaker material with a low dielectric constant. Relatively economical flood-exposure tools may be used to provide UV light and activate the decomposition.

In one embodiment of the invention, as shown in block 103, the substrate then may be heated to cause the low molecular weight decomposition products to diffuse. Optionally, diffusion may occur through a non-hermetic porous capping layer. Upon heating, the decomposition products such as diphenyl sulfide and propene volatilize, leaving void volumes in the locations previously occupied by the antenna. As a result, as photosensitive moieties in the dielectric material decompose and volatilize, pores are formed in the dielectric layer.

The choice of the photosensitive moiety (the "antenna") may be based on the volume occupied by the moiety which determines the size of the remaining void (after application of UV light and decomposition), and the concentration of the moiety relative to the backbone, which determines the void volume after decomposition.

Additionally, in one embodiment, a plasma such as $H_2$ may be used to modify one or more remaining functional groups in the dielectric layer. For example, $H_2$ plasma may be used to reduce a carboxylate group to an alkyl group or other functional groups having lower polarization, and thus, lower contribution to the overall dielectric constant of the remaining porous dielectric.

Figure 2A:
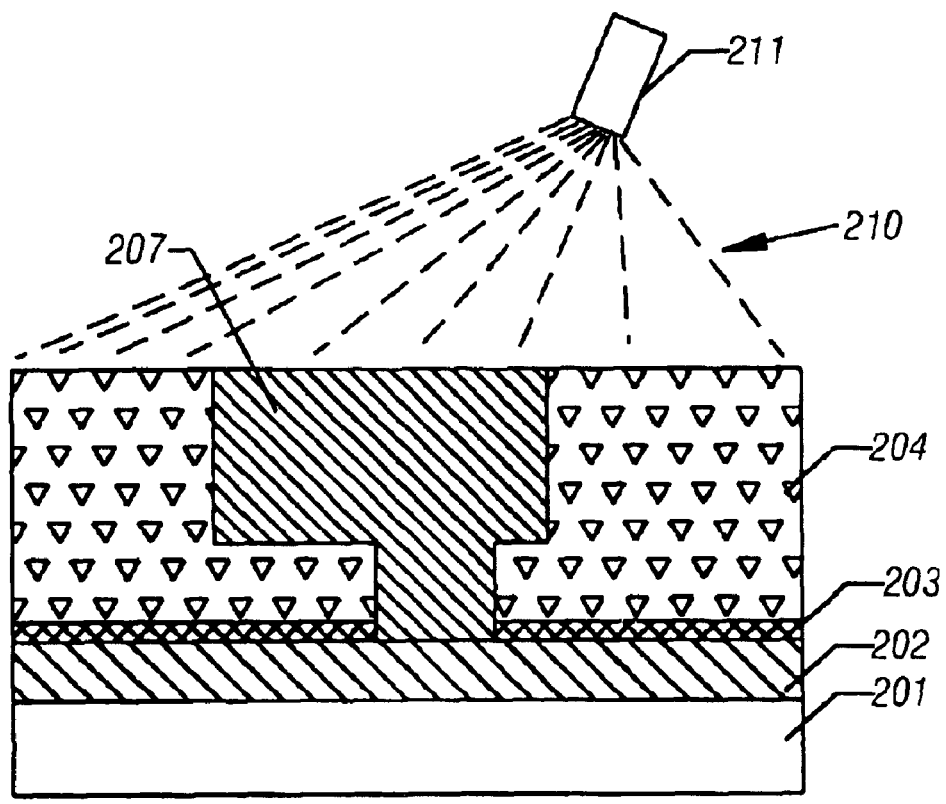
FIGS. 2A–2B provide a schematic representation of a porous dielectric layer formed on a semiconductor substrate in one embodiment.
Figure 2B:
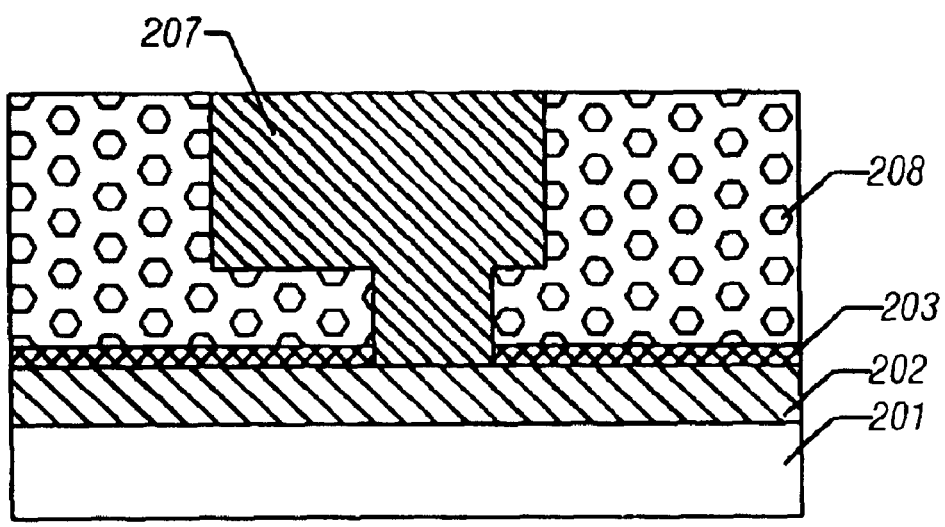

FIGS. 2A–2B illustrate cross-sections of a device that may be made using a method according to one embodiment of the invention. In this embodiment, UV light is provided to activate the porogen after interconnects are formed in or through the dielectric layer. However, in other embodiments, application of UV light may occur before the interconnects are formed.

The device shown in FIGS. 2A and 2B includes a substrate 201 upon which is formed a conductive layer 202. Conductive layer 202 is covered by barrier layer 203, which in turn is covered by dielectric layer 204 containing UV-activated pore-generating material.

Substrate 201 on which the dielectric may be deposited may be any surface, generated when making a semiconductor device, upon which an insulating layer may be formed. The substrate may include, for example, active and passive devices that are formed on a silicon wafer such as transistors, capacitors, resistors, diffused junctions, gate electrodes, local interconnects, etc. The substrate also may include insulating materials (e.g., silicon dioxide, either undoped or doped with phosphorus (PSG) or boron and phosphorus (BPSG); silicon nitride; silicon oxynitride; silicon carbide; carbon doped oxide; or a polymer) that separate such active and passive devices from conductive layers that are formed on top of them, and may include various types of conductive layers.

Conductive layer 202 may be made from materials conventionally used to form conductive layers for integrated circuits. For example, conductive layer 202 may be made from copper, a copper alloy, aluminum or an aluminum alloy, such as an aluminum/copper alloy. Alternatively, conductive layer 202 may be made from doped polysilicon or a silicide, e.g., a silicide comprising tungsten, titanium, nickel or cobalt.

Conductive layer 202 may include a number of separate layers. For example, conductive layer 202 may comprise a primary conductor made from an aluminum/copper alloy that is sandwiched between a relatively thin titanium layer located below it and a titanium, titanium nitride double layer located above it. Alternatively, conductive layer 202 may comprise a copper layer formed on underlying barrier and seed layers.

Although a few examples of the types of materials that may form conductive layer 202 have been identified here, conductive layer 202 may be formed from various other materials that can serve to conduct electricity within an integrated circuit. Although copper is preferred, the use of any other conducting material, which may be used to make an integrated circuit, falls within the spirit and scope of the present invention.

Barrier layer 203 covers conductive layer 202. Barrier layer 203 may inhibit diffusion into dielectric layer 204 of copper or other elements that may be included in conductive layer 202. In addition, barrier layer 203 may perform an etch stop function—a function which may be particularly desirable if an opening etched through the overlying dielectric layer is unlanded. Barrier layer 203 preferably comprises silicon nitride or silicon carbide, but may be made of other materials that can inhibit diffusion from conductive layer 202 into dielectric layer 204 and provide high selectivity to etch chemistry used to etch a layer, or layers, formed on top of barrier layer 203. Other materials that may provide such properties include titanium nitride and oxynitride.

Barrier layer 203 should be thick enough to perform such functions, but not so thick that it adversely impacts the overall dielectric characteristics resulting from the combination of barrier layer 203 and dielectric layer 204. To balance these factors, the thickness of barrier layer 203 preferably should be less than about 10% of the thickness of dielectric layer 204.

The dielectric layer may be a variety of materials ranging from a spin-on glass to organic materials such as paralyene. The dielectric material forming the layer provides a "backbone" onto which one or more photosensitive moieties may be linked and functionalized.

Metal interconnect 207 may be formed in an opening in the dielectric layer. The metal interconnect may be formed by patterning openings in the dielectric layer using dual damascene, single damascene, or similar processes. The openings may be trenches and/or vias patterned using photolithography processes, with dielectric material removed by etching. An anti-reflective or light absorbing layer may be applied over specified areas of the dielectric layer during the lithography process to prevent premature decomposition of the UV light-activated porogens. Forming the metal interconnect also may include related chemical mechanical polishing (CMP) or planarizing steps.

As shown in FIG. 2A, UV light source 211 directs or radiates UV light 210 onto the dielectric layer. The UV light source may, for example, flood exposed portions on the surface of the substrate with UV light.

FIG. 2B shows the resulting structure that includes dielectric material having pores 208. The material may be at least 50% porous, resulting in a low dielectric constant. The metal interconnects adjacent the dielectric layer also may have smooth sidewalls.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:

forming a dielectric layer on a substrate, the dielectric layer including a photosensitive moiety linked to a dielectric material; and radiating ultraviolet light on the dielectric layer to unlink the photosensitive moiety from the dielectric material to generate an acid and to form a pore in the dielectric layer.

2. The method of claim 1 further comprising forming a metal interconnect in an opening in the dielectric layer.

3. The method of claim 1 wherein radiating ultraviolet light on the dielectric layer to unlink the photosensitive moiety generates an acid.

4. The method of claim 1 further comprising heating the dielectric layer after radiating ultraviolet light on the dielectric layer.

5. The method of claim 1 further comprising forming a porous capping layer over the dielectric layer.

6. The method of claim 1 further comprising forming an anti-reflective layer over the dielectric layer before radiating ultraviolet light on the dielectric layer.

7. A method comprising:

directing an ultraviolet light on a dielectric material to dissociate a light-absorbing component from the dielectric material, the dissociation generating a volatile material; and heating the dielectric material to remove the volatile material therefrom, the removal of the volatile material forming pores in the dielectric material.

8. The method of claim 7 further comprising forming an opening in the dielectric material for a metal interconnect.

9. The method of claim 8 wherein forming an opening in the dielectric material for a metal interconnect comprises a dual damascene process.

10. The method of claim 7 wherein the light-absorbing component comprises a photosensitive portion of a photo-acid generator.

11. The method of claim 7 wherein the dielectric material functionality after dissociation comprises at least an acid.

12. A method comprising:

forming a dielectric layer on a substrate, the dielectric layer including a photosensitive moiety including a photoacid generator; and radiating ultraviolet light on the dielectric layer to release the photosensitive moiety from the dielectric layer and form a pore in the dielectric layer.

13. The method of claim 12 further comprising forming a metal interconnect in an opening in the dielectric layer.

14. The method of claim 12 further comprising heating the dielectric layer after radiating ultraviolet light on the dielectric layer.

15. The method of claim 12 further comprising forming a porous capping layer over the dielectric layer.

16. The method of claim 12 further comprising forming an anti-reflective layer over the dielectric layer before radiating ultraviolet light on the dielectric layer.

* * * * *